United States Patent
Pfeiffer et al.

(10) Patent No.: US 7,278,072 B2
(45) Date of Patent: Oct. 2, 2007

(54) METHOD AND AUXILIARY DEVICE FOR TESTING A RAM MEMORY CIRCUIT

(75) Inventors: Johann Pfeiffer, Ottobrunn (DE); Helmut Fischer, Oberhaching (DE)

(73) Assignee: Infineon Technologies AG, Munich (DE)

(*) Notice: Subject to any disclaimer, the term of this patent is extended or adjusted under 35 U.S.C. 154(b) by 395 days.

(21) Appl. No.: 10/429,579

(22) Filed: May 5, 2003

(65) Prior Publication Data

US 2003/0217313 A1    Nov. 20, 2003

(30) Foreign Application Priority Data

May 3, 2002    (DE) ................ 102 19 782

(51) Int. Cl.
G11C 29/26    (2006.01)
G11C 29/50    (2006.01)

(52) U.S. Cl. ........................ 714/718; 714/719
(58) Field of Classification Search .......... 714/718, 714/719, 763, 734, 724, 735, 733, 25, 42, 714/54, 702; 365/200, 201
See application file for complete search history.

(56) References Cited

U.S. PATENT DOCUMENTS

| | | | |
|---|---|---|---|
| 4,860,259 A | | 8/1989 | Tobita |
| 5,022,007 A * | | 6/1991 | Arimoto et al. ............. 365/201 |
| 5,293,386 A * | | 3/1994 | Muhmenthaler et al. ..... 714/718 |
| 5,475,692 A * | | 12/1995 | Hatano et al. .............. 714/719 |
| 6,092,227 A | | 7/2000 | Toki et al. |
| 2002/0134994 A1* | | 9/2002 | Krause et al. .............. 257/200 |

FOREIGN PATENT DOCUMENTS

DE    198 18 045 A1    3/1999

* cited by examiner

*Primary Examiner*—Guy Lamarre
*Assistant Examiner*—Dipakkumar Gandhi
(74) *Attorney, Agent, or Firm*—Laurence A. Greenberg; Werner H. Stemer; Ralph E. Locher

(57) ABSTRACT

The testing of a RAM memory circuit containing a multiplicity of memory cells can in each case be selected in groups of $n \geq 1$ memory cells by using an applied address information item in order to write in or read out groups of in each case n data. According to the invention, in a test write cycle, a plurality $i=j*m$ of the memory cell groups are selected, where j and m are in each case integers $\geq 2$, and the same datum is written into all the memory cells of in each case m selected memory cell groups. In a subsequent read cycle, the i memory cell groups selected in the write cycle are selected and read in a sequence such that the read-out data groups from in each case m memory cell groups at which the same datum was written in are provided simultaneously or in direct succession as a read data block comprising m*n data. Each time a read data block is provided, a compressed test result is determined and provided; the result indicates if all m*n data of the read data block provided correspond to the datum written therein.

6 Claims, 4 Drawing Sheets

METHOD AND AUXILIARY DEVICE FOR TESTING A RAM MEMORY CIRCUIT

BACKGROUND OF THE INVENTION

Field of the Invention

The invention relates to a method and an auxiliary device for testing a RAM memory circuit.

The acronym "RAM" (derived from "random access memory") is usually used to denote a data memory having a multiplicity of memory cells, each of which can store a datum and which can be accessed selectively and directly by using a selection device in order optionally to write in or read out data. The memory cells are combined in one or more separate cell arrays, so-called "banks". The selection device contains address decoders, a network of selection lines and a network of data paths and is usually integrated together with the memory cells and further auxiliary circuits on one and the same chip. The overall RAM memory circuit thus formed has external terminals for inputting and outputting the data to be written or read, for applying address information items for identifying the memory cells to be selected for writing or reading, and also further external terminals for command signals and clock signals for initiating and controlling various operating sequences.

The abovementioned selection device responds to the respectively applied address information in order to select the ("addressed") memory cells identified by the information for write or read operation. This selection is effected, in principle, by the selection device exciting selection lines that are selected depending on the address information in order to actuate assigned switches in the data path network and thereby to through-connect data transfer paths between the addressed memory cells and an internal data bus which leads to the external data terminals.

On account of this selection process, write data provided when a write command appears on the data bus find their way into the addressed memory cells, and, when a read command appears, the data contained in the addressed memory cells find their way to the data bus. Typically, the data bus is a parallel bus for simultaneously transferring n data, and the selection device is constructed in such a way that, with one address information item, in each case a group of n memory cells can be simultaneously addressed and selected for writing or reading.

In order to check the functionality of a RAM memory circuit, different tests are necessary at different stages of production. In principle, such tests involve writing a respectively specific datum to each memory cell and, during subsequent read accesses, checking if the data read out correspond to the data previously written in. In particular, when the finished chip is subjected to the final test, it may be expedient to write the same preselected datum to a respective subset of memory cells including at least a group of n simultaneously selectable memory cells. During each read access, in each case all n memory cells of such a group are read simultaneously, and a check is made to determine whether or not all n read-out data of this group correspond to the preselected datum. Thus, in each case, n memory cells are tested simultaneously with each read access.

Memory tests are carried out with the aid of external test units which operate according to a selectable test program in order to provide the respective address and data information items for the selection of the memory cells and for the data to be written in, additionally to supply command bits for predetermining the respective operating mode of the memory circuit and to generate strobe signals for the interrogation of the test results. The operating speed of such test units is subject to an upper limit. This relates in particular to the maximum repetition frequency of the strobe signals. Since the data rates of memories increase to an ever greater extent with advancing development of the memory technology, increasingly the problem arises that the strobe signals of existing test units can no longer follow the clock of the read accesses at the memory.

The term "data rate", which belongs to the specification of a memory circuit, is understood to be the repetition frequency at which data or groups of parallel data bits can be successively input and output at the data terminals of the memory circuit. In the case of RAMs of single data rate (SDR) operation, the data rate corresponds to the access clock rate, i.e. the repetition frequency at which different memory cells (or memory cell groups) can be successively selected for writing or reading. In the case of RAMs of multiple data rate operation, the data rate corresponds to an integer multiple of the access clock rate, for example double (DDR) or even quadruple (DDR-II) the clock rate.

Test units are very expensive (of the order of a few million euros); to be precise, they are all the more expensive, the higher their maximum operating speed. In order to save the procurement costs for faster test units and to manage with a slow test unit, it has been necessary heretofore to make compromises. One possible compromise would be to operate the memory in the test mode with a lower data rate than the nominal value, but this has the disadvantage that the test does not take account of the actually envisaged conditions of use for the memory. Another compromise is to operate the memory in the test mode with its fast nominal data rate and to configure the test program such that, during the interrogations of the test results within a test run, individual read accesses are skipped by interrogating the test results of only every second (or of only every third or fourth, etc.) read access. However, this has the disadvantage that the test run has to be repeated once (or a number of times) in order to make up the test of the skipped read accesses.

SUMMARY OF THE INVENTION

It is accordingly an object of the invention to provide a method and an auxiliary device for testing a ram memory circuit that overcome the hereinafore-mentioned disadvantages of the heretofore-known devices of this general type and that provide a technique that makes it possible to shorten the total time for a complete memory test without having to increase the repetition frequency of the interrogation of the test results.

With the foregoing and other objects in view, there is provided, in accordance with the invention, a method tests a RAM memory circuit containing a multiplicity of memory cells that can, in each case, be selected in groups of $n \geq 1$ memory cells by using an applied address information item in order to write in or read out groups of in each case n data at them.

According to the invention, the method includes the following steps: first of all, in a write cycle, a plurality $i=j*m$ of the memory cell groups are selected, where j and m are in each case integers $\geq 2$, and the same datum is written in at all the memory cells of in each case m selected memory cell groups. In a subsequent read cycle, the i memory cell groups selected in the write cycle are selected and read out in a sequence such that the read-out data groups from in each case m memory cell groups at which the same datum was written in are provided simultaneously or in direct succession as a read data block including m*n data. Each time a read data block is provided, a compressed test result is determined and provided, the result indicating if all m*n data of the read data block provided correspond to the datum written in.

The invention is also realized by a test auxiliary device for testing a RAM memory circuit that contains a multiplicity of memory cells, an input/output device for receiving and outputting memory data and an address input for the application of address information items and has a selection device in order to select groups of in each case n≧1 memory cells depending on the applied address information and to write in or read out a group of n data at the respectively selected memory cell group. The invention provides a test control device and an evaluation device, the test control device being constructed for applying control, data and address information items to the selection device which are such that, in a write cycle, a plurality i=j*m of the memory cell groups are selected, where j and m are in each case integers ≧2, and the same datum is written in at all the memory cells of in each case m selected memory cell groups and such that, in a subsequent read cycle, the i memory cell groups selected in the write cycle are selected and read out in a sequence such that the read-out data groups from in each case m memory cell groups at which the same datum was written in are provided simultaneously or in direct succession as a read data block including m*n data. The evaluation device is constructed in such a way that, each time a read data block is provided, it determines and provides a compressed test result which indicates if all m*n data of the read data block provided correspond to the datum written in.

The invention has the advantage that fast memories can be tested under operation with a high clock rate permitted in accordance with the specification in a correspondingly short time even by using relatively slow test units. Consequently, it is possible to use, for testing the most modern memories, the slower test units that already exist or can be purchased relatively inexpensively, without having to accept the long test times that have been customary heretofore.

Other features that are considered as characteristic for the invention are set forth in the appended claims.

Although the invention is illustrated and described herein as embodied in a method and an auxiliary device for testing a RAM memory circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
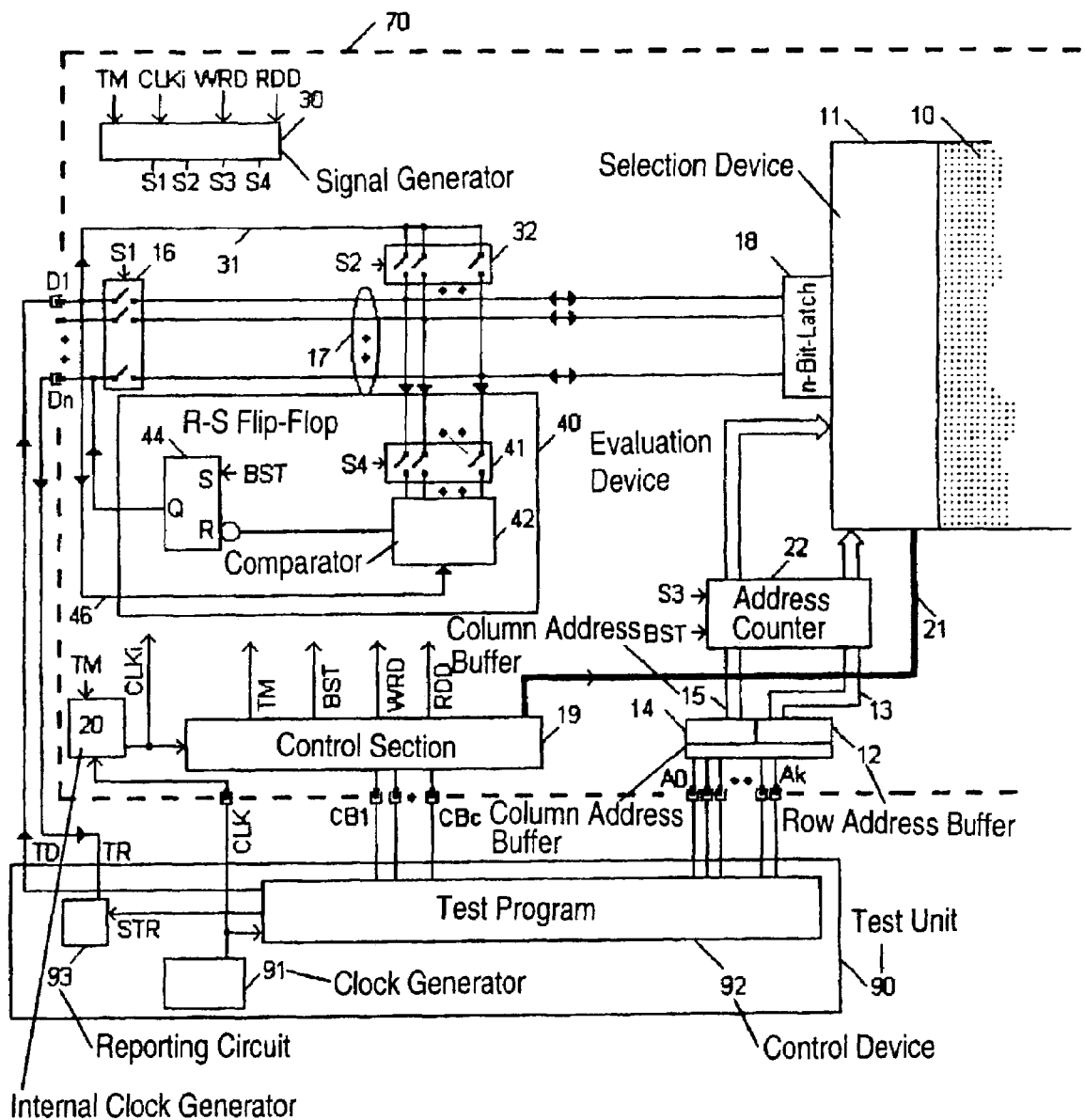
FIG. 1 is a partial diagrammatic and partial schematic view of a configuration containing an SDR-DRAM memory circuit with a test auxiliary device according to the invention and a connected test unit.

Referring now to the figures of the drawings in detail and first, particularly to FIG. 1 thereof, there is shown the memory circuit 70, which is a dynamic type constructed for single data rate (SDR) (SDR-DRAM) and, with all its sections depicted within the dashed border, forms an integrated circuit on a single semiconductor chip. A DRAM memory bank 10, containing a multiplicity of memory cells (not shown) configured in matrix form in rows and columns, is illustrated schematically and in fragmentary fashion on the right. The memory cells can be accessed selectively by using a selection device 11 in order to write in or read out data. The selection device 11 is constructed in such a way that it can simultaneously select in each case a group of n memory cells. The respective memory cell group can be predetermined by an address information item, including a plurality of row address bits which are supplied from a row address buffer 12 via a row address bus 13, and a plurality of column address bits which are supplied from a column address buffer 14 via a column address bus 15. The row and column address bits are applied externally to the address buffers 12 and 14 via address terminals A[0:k] of the chip. The selection device 11 contains a row and a column address decoder (not shown) in order to decode the address bits and to derive therefrom suitable activation and control signals for the selection of the memory cells.

As known per se, measures are implemented in the memory circuit 70 according to FIG. 1 in order to internally generate a "burst" of a plurality of successive addresses from an address information item which is input externally at the address terminals A[0:k], so that, after the external address information has been input, a plurality of memory cell groups can automatically be selected one after the other. For this purpose, there is usually provided an address changeover unit in the form of an address counter that can be actuated with the timing of the read or write operation in order to advance, at its binary count outputs, individual bits of the row address and/or of the column address via different bit patterns. In FIG. 1, the address counter is illustrated symbolically by a block 22 in the path of the address buses 13 and 14. The address counter 22 can be preset by a "burst start" signal BST, for supplying a start address, which is determined by the external address information, and then counts under the control of a switching signal S3 in the form of counting pulses with the clock rate CLKi, in order to successively supply the following addresses of the burst to the selection device 11. The so-called "burst length" specifies how many addresses are supplied per burst. In the case of SDR memory circuits, the burst length also specifies how many memory cell groups are selected per external address information item.

For inputting and outputting data, n data terminals D[1:n] are provided, which are connected to an internal data bus 17, containing n parallel data lines, via a switchable bidirectional data port, which is illustrated symbolically as an n-pole line switch 16. The data bus 17 is connected to the selection device 11 via an n-bit latch 18, which holds the write data supplied via the data bus 17 or the read data supplied by the selection device 11 until new write or read data arrive in each case.

In order to control the operating sequences for the writing and reading of data, a control section 19 is provided, which has an input for receiving an internal clock signal CLKi and additionally has the customary command inputs for receiving c external command bits CB[1:c]. The internal clock signal CLKi is supplied by an internal clock generator 20, which is synchronized by an external clock signal CLK which, just like the control commands mentioned, can be fed via assigned control terminals at the chip.

In response to the internal clock signal CLKi and the command bits CB[1:c], the control section 19 supplies, via a bundle of control lines 21, the required control signals to the selection device 11 for the time-controlled performance of the diverse switching operations in order that the memory cell groups predetermined by the row and column addresses are connected to the latch 18 selectively for writing in and reading out data. The control section furthermore supplies a test mode setting signal TM, the burst start signal BST already mentioned and, in addition, a write operation signal WRD and a read operation signal RDD. The construction and operation of the control section 19 and of the selection device 11 need not be discussed in detail here since suitable implementations are generally known.

In order to test if a memory circuit outputs the written-in data in uncorrupted form again, use is made of test units that can be connected to the address, control and data terminals of the memory circuit in order to instigate a writing and reading of data at the memory cells in accordance with a selectable test program. A typical test unit is illustrated schematically in the lower part of FIG. 1 and is designated in its entirety by the reference numeral 90. It contains a dedicated clock generator 91 for supplying the clock signal CLK to the clock control terminal of the memory circuit to be tested, a sequence control device 92 and a reporting circuit 93. The sequence control device 92 supplies, under the time control of the clock signal CLK and in accordance with the respective test program, the control commands and the address information items for the read and write operation to the relevant terminals of the memory circuit and also a test data information item at a test data output TD for predetermining the data that are respectively to be written in. The reporting circuit 93 has a test result input TR in order to receive from the memory circuit a test result which specifies whether a test is "passed" or "not passed". The reporting circuit furthermore has a sampling input for receiving a strobe signal STR, which is supplied by the sequence control device 92 in order to cause the reporting device 93 to report the received test result after each individual test process.

Memory test units such as e.g. the test unit 90 usually only supply the external command and data information items for the memory operation and also the clock signal CLK for synchronizing memory operation with the test unit, while the determination of the test result is performed by a separate auxiliary device which is specially coordinated with the architecture and the specifications of the memory circuit and is preferably integrated on the same chip as the memory circuit. In the case of more recent memory circuits which are constructed for increasingly higher operating speeds, the test auxiliary device is also constructed for correspondingly high speed. As already mentioned in the introduction, however, it is often not expedient for economic reasons to procure correspondingly fast memory test units.

The present invention provides for a memory circuit to be operated in a test mode in such a way that the memory cells, on the one hand, are tested at precisely the speed corresponding to the data rate that is to be provided for normal operation, but, on the other hand, the test results determined during the test are provided in real time and without any gaps with a repetition frequency which is significantly lower than the data rate. Consequently, a slow test unit can also keep up and provide gap-free sampling of all the test results provided.

Figure 2:
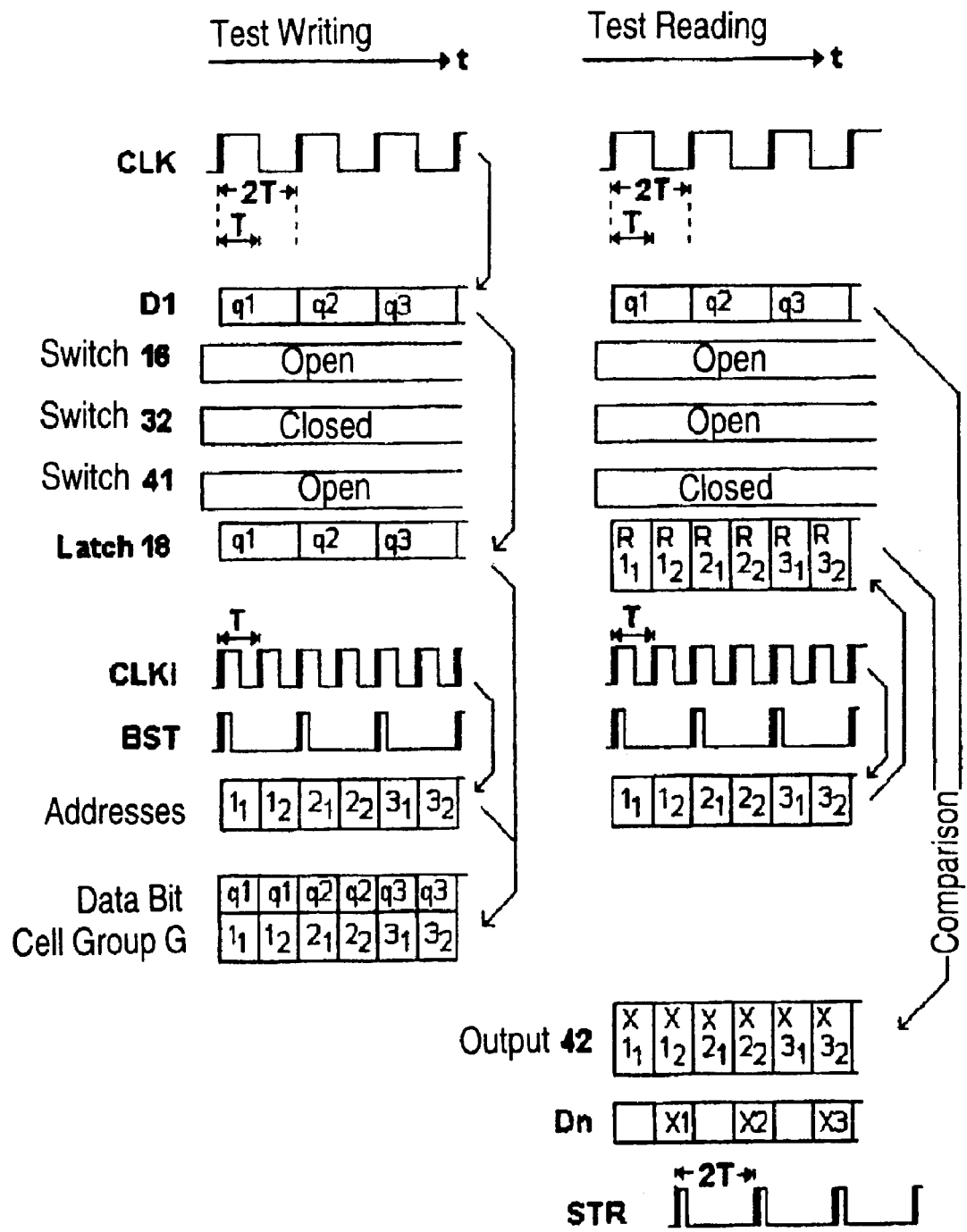
FIG. 2 is a timing diagram for elucidating the operation of the configuration according to FIG. 1.

A test mode according to the invention is described below firstly using the example of the memory circuit 70 shown in FIG. 1, which, as stated, is a DRAM memory circuit of single data rate operation (SDR-DRAM). In order to realize the test mode in the memory circuit 70, an auxiliary device is provided whose elements 30-46 are described together with the timing diagram which is shown in FIG. 2 and illustrates the operating sequences of the test mode.

The test mode is activated by the active state of the test mode setting signal TM, which is decoded by the control section 19 from the command bits CB[1:c] supplied by the test unit 90. The test mode includes a write operation and a subsequent read operation with evaluation of the data read. In this case, the address, control and clock information items are derived from the internal address buffer 12, the internal control section 19 and the internal clock generator 20, which, for their part, are connected to the test unit 90 which prescribes the test program. The clock CLK of the test unit, which also synchronizes the internal clock generator 20, is set to half the frequency of the internal clock signal CLKi which is supplied by the internal clock generator 20 and, for its part, determines the data rate. The clock generator 20 is set by the active test mode setting signal TM in such a way that it generates the internal clock signal CLKi with twice the frequency of the external clock signal CLK.

Firstly, the write operation of the test mode shall be explained. The test write operation, the sequence of which is illustrated in the left-hand part of FIG. 2, runs for the duration of a write operation signal WRD provided by the control section 19. During the test write operation, the n-pole line switch 16 is open by virtue of a switching signal S1, so that the data bus 17 is disconnected from the data terminals D[1:n]. With the timing of the external clock signal CLK, the test unit 90 supplies successive test write data q1, q2, q3, etc., each including a single bit with the binary value "0" or "1", to the data input D1. From there, the data pass via a line 31, which bridges the open switch 16, and an n-pole switch 32, which is kept closed by a switching signal S2 only during the test write operation, and are in each case passed onto all n lines of the data bus 17. The n-bit latch 18 thus provides each of the data for the duration of two periods of the fast internal clock signal, to be precise as an n-bit data word in which all the bits have the value of the test datum. Consequently, the respective same datum "0" or "1" can be written successively, in two successive periods of the fast clock signal CLKi, to all the memory cells of two different groups.

In order to select the individual memory cell groups during this fast test write operation, the addresses applied to the selection device 11 have to be changed according to plan, and in a manner following the fast clock CLKi. Since the test unit 90 can supply successive address information items via the address terminals A[0:k] only with the slow clock CLK, two different addresses have to be derived in rapid succession from each address information item supplied. This can be done in a simple manner e.g. by using the address counter 22 described above, the burst length being set to a value $r \geq 2$. In the exemplary embodiment described here, the value r=2 is chosen for the burst length. In other words, each time an external address information item is applied, the address counter 22 is set to a start address corresponding to this address information item and, after a period of the internal fast clock CLKi, is advanced once by the signal S3 in order to supply a subsequent address.

Thus, with a first clock pulse of the fast clock signal CLKi, the first datum q1 is written to all n memory cells of a first group $G1_1$ of a first memory cell group pair, in accordance with the start address which is predetermined by the first external address information item. With the next clock pulse, the first datum q1 is written to all the memory cells of a second group $G1_2$ of the first group pair G1. The second datum q2 is then written in a similar manner firstly to a first group $G2_1$ and subsequently to a second group $G2_2$ of a second group pair G2. The procedure continues thus until, after a total of i cycles, a plurality or all of the memory cell groups of the matrix 10 have been filled in pairs (and with the same datum "0" or "1" within each of the i pairs).

After this test write operation, the test read operation described below begins, the sequence of which is illustrated on the right in FIG. 2. During the test read operation, which runs for the duration of a read operation signal RDD provided by the control section 19, the switch 16 remains open, as before, whereas the switch 32 is closed. A further n-pole switch 41, which was open during the test write operation, is kept closed by a switching signal S4 in order now to connect the data bus 17 to an n-bit signal input of a comparator 42. The switch 41 and the comparator 42 are, with further elements yet to be described, part of an evaluation device 40.

In the test read operation, too, the test unit 90 supplies successive address information items with the slow clock CLK. At the same time as the address information items, it supplies, with the rising edges of the clock signal CLK, the associated test data q1, q2, etc. from its test data output TD to the data terminal D1. The test program ensures that the assignment of the binary value of these test data to the address information is the same in this case as in the case of the test write operation described above. From the terminal D1, owing to the open state of the switches 16 and 32, however, the test data do not pass onto the data bus 17, but rather via a line 46 to a reference input of the comparator 42.

The address counter 22 is controlled by the fast clock signal CLKi in the same way as during the test write operation. Consequently, when the first address information item is applied, firstly the data of all n memory cells of the first group $G1_1$ of the memory cell group pair G1 are loaded into the latch 18 as an n-bit data word $R1_1$, and then the data of all n memory cells of the second group $G1_2$ of the group pair G1 are loaded into the latch 18 as an n-bit data word $R1_2$. Afterward, when the second address information item is applied, firstly the data of all n memory cells of the first group $G2_1$ of the second group pair G2 are loaded into the latch 18 as an n-bit data word $R2_1$, and then the data of all n memory cells of the second group $G2_2$ of the second group pair G2 are loaded into the latch 18 as an n-bit data word $R2_2$. This interplay continues such that the latch 18 provides successively readout n-bit data words $R1_1$, $R1_2$, $R2_1$, $R2_2$, $R3_1$, $R3_2$, etc. with the timing of the fast clock signal CLKi.

The stream of these n-bit data words passes via the data bus 17 and the closed switch 41 to the n-bit signal input of the comparator 42. The comparator 42 supplies at its output a logic "1" precisely when all n bits at the signal input have the same value as the test data bit at the reference input. This test data bit is present in each case for the duration of an entire period of the slow clock signal CLK, during which two successive data words read from two memory cell groups which have previously been filled with the same test datum arrive at the n-bit signal input.

The comparator 42 firstly compares the data word $R1_1$ with the test datum q1. If no error is present, then all n bits of $R1_1$ are identical to q1, and the comparator supplies, as first partial result $X1_1$, a "1" ("test passed") at its output, otherwise a "0" is supplied ("test not passed"). Afterward, during the next clock cycle of CLKi, the comparator 42 compares the data word $R1_2$ with the test datum q1. If no error is present, then all n bits of $R1_2$ are identical to q1, and the comparator supplies a "1" as second partial result $X1_2$; otherwise a "0" is supplied. This interplay is continued in a similar manner in order successively to compare the data words $R2_1$, $R2_2$ with the test datum q2, then to compare the data words $R3_1$, $R3_2$ with the test datum q3, etc.

For the purpose of further evaluation, the evaluation device 40 additionally contains an RS flip-flop 44, whose S input (set input) is connected for receiving the burst start signal BST. The output of the comparator 42 is connected in inverted fashion to the R input (reset input) of the RS flip-flop 44. With the beginning of each address burst, that is to say with the application of an external address information item at the beginning of each full period of the slow external clock signal CLK, the signal BST appears, as a result of which the output of the flip-flop is set to "1". As long as the output of the comparator 42 is at "1" and thus indicates partial results "test passed", the R input of the flip-flop 44 remains held at "0", and the flip-flop does not change its state. As soon as the comparator supplies a partial result "not passed" (that is to say a "0"), the R input of the flip-flop 44 goes to "1", and the output of the flip-flop 44 goes to "0" and maintains this state until the end of the started period of the slow external clock CLK. Only with the beginning of the next period of the slow external clock CLK, that is to say with the beginning of the next address burst, is the flip-flop 44 set again by the burst start signal BST.

Thus, in each case for the duration of the second half-period of the slow clock CLK, the output of the flip-flop 44 exhibits the common "compressed" test result TR of a respective block of two read data words which originate from two data accesses. The output of the flip-flop 44 is connected to the test result input TR of the test unit 90 via the data terminal Dn. Thus, the test result can be sampled at the reporting circuit 93 in every second half-period of the slow clock CLK by using the correspondingly slow strobe signal STR with half the repetition frequency of the data accesses, and, nevertheless, none of the data accesses is skipped.

In order to generate the switching signals S1, S2, S4 for the switches 16, 32, 41 and the counting pulses S3 for the address counter 22, the test auxiliary device contains a switching signal generator 30, which the test mode setting signal TM causes to derive the switching signals from the internal clock signal CLKi and from the write and read operation signals WRD and RDD, respectively, which, for their part, are supplied by the control section 19 of the memory circuit 70. In normal operation of the memory circuit 70, the signal TM is kept inactive, so that the internal clock CLKi runs freely or (in the case of a synchronous DRAM) is synchronized or replaced by an external fast clock. This causes the internal clock generator 20 to generate CLKi with the same frequency as CLK, and causes the switching signal generator 30 to generate the switching signals in such a way that the switches 32 and 41 are kept open and that the switch 16 (data port) is keyed in a manner synchronized with the clock CLKi in order to clock the inputting and outputting of the data.

Figure 3:
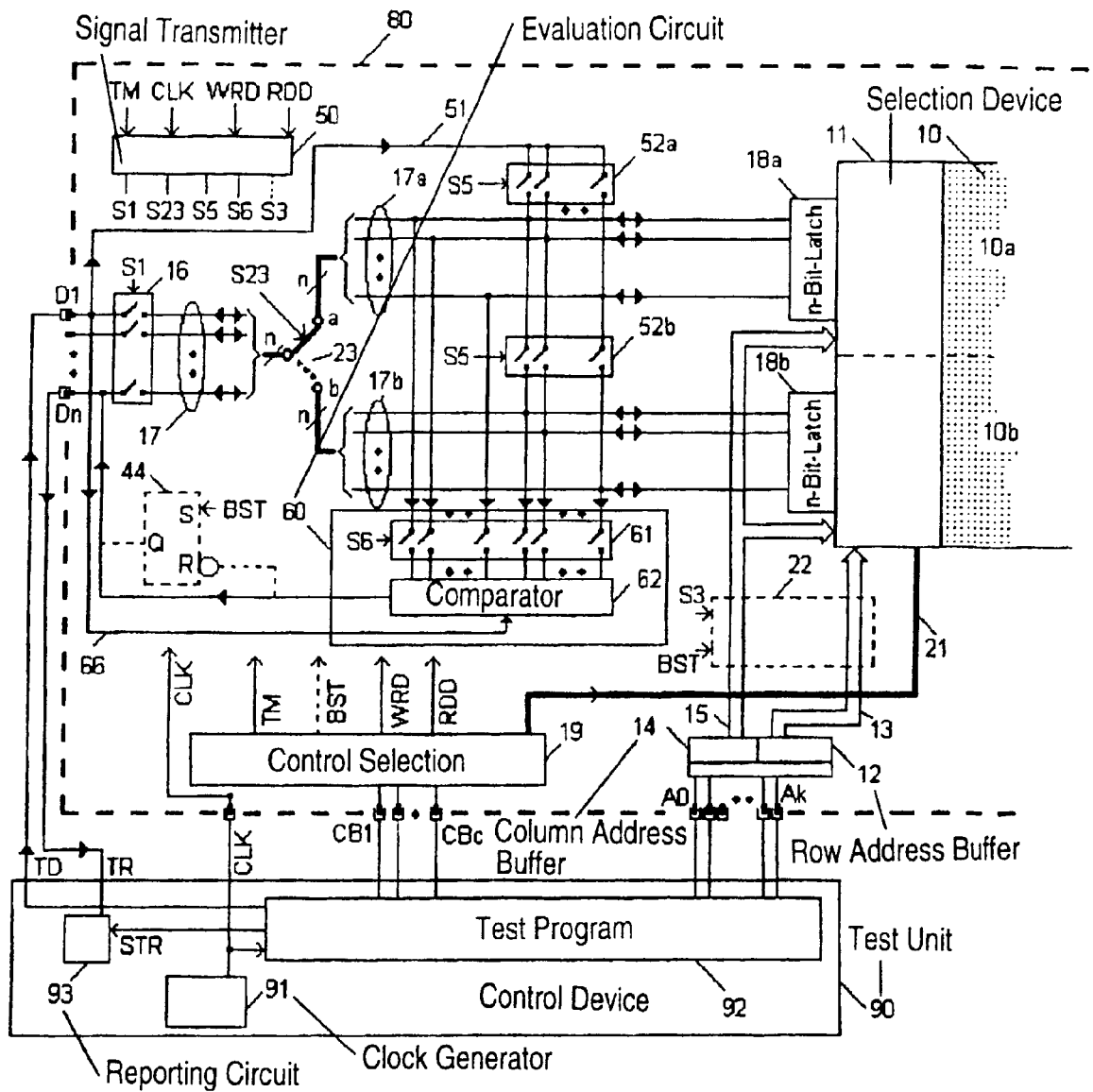
FIG. 3 is a partial diagrammatic and partial schematic view of a configuration containing a DDR-DRAM memory circuit with a test auxiliary device according to the invention and a connected test unit.

A test mode according to the invention is described below using the example of the memory circuit 80 which is shown in FIG. 3 and is a DRAM memory circuit of double data rate operation (DDR-DRAM).

The memory circuit 80 is integrated on a semiconductor chip whose boundaries are illustrated by the dashed border and which has, in a manner similar to the memory circuit 70 according to FIG. 1, data terminals D1 to Dn for the parallel inputting and outputting of n parallel data streams, address terminals A0 to Ak for the application of address bits, a terminal for the application of an external clock signal CLK and inputs for command bits CB[1:c].

The known components of the memory circuit 80 include: a memory bank 10 having a multiplicity of memory cells configured in rows and columns, divided into two memory areas 10a and 10b; a data port—illustrated symbolically as an n-pole line switch 16—between the data terminals D[1:n] and an internal data bus 17 for the parallel transfer of n-bit data streams; a demultiplexer/multiplexer—illustrated as an n-pole changeover switch 23—for connecting the data bus 17 optionally to a first n-bit branch bus 17a, which leads to a first n-bit latch 18a, or to a second n-bit branch bus 17b, which leads to a second n-bit latch 18b; row and column address buffers 12 and 14 for providing the row and column address bits received via the address terminals A[0:k] on a row and a column address bus 13 and 15, respectively; a control section 19 that responds to the clock signal CLK and the abovementioned command bits and serves for supplying various control signals; a selection device 11, which responds to control signals from the control section and to the respectively provided address bits, in order to produce connections between selected memory cells of the areas 10a and 10b and the latches 18a and 18b, respectively, for writing in and reading out memory data via the branch buses 17a and 17b, respectively.

Figure 4:
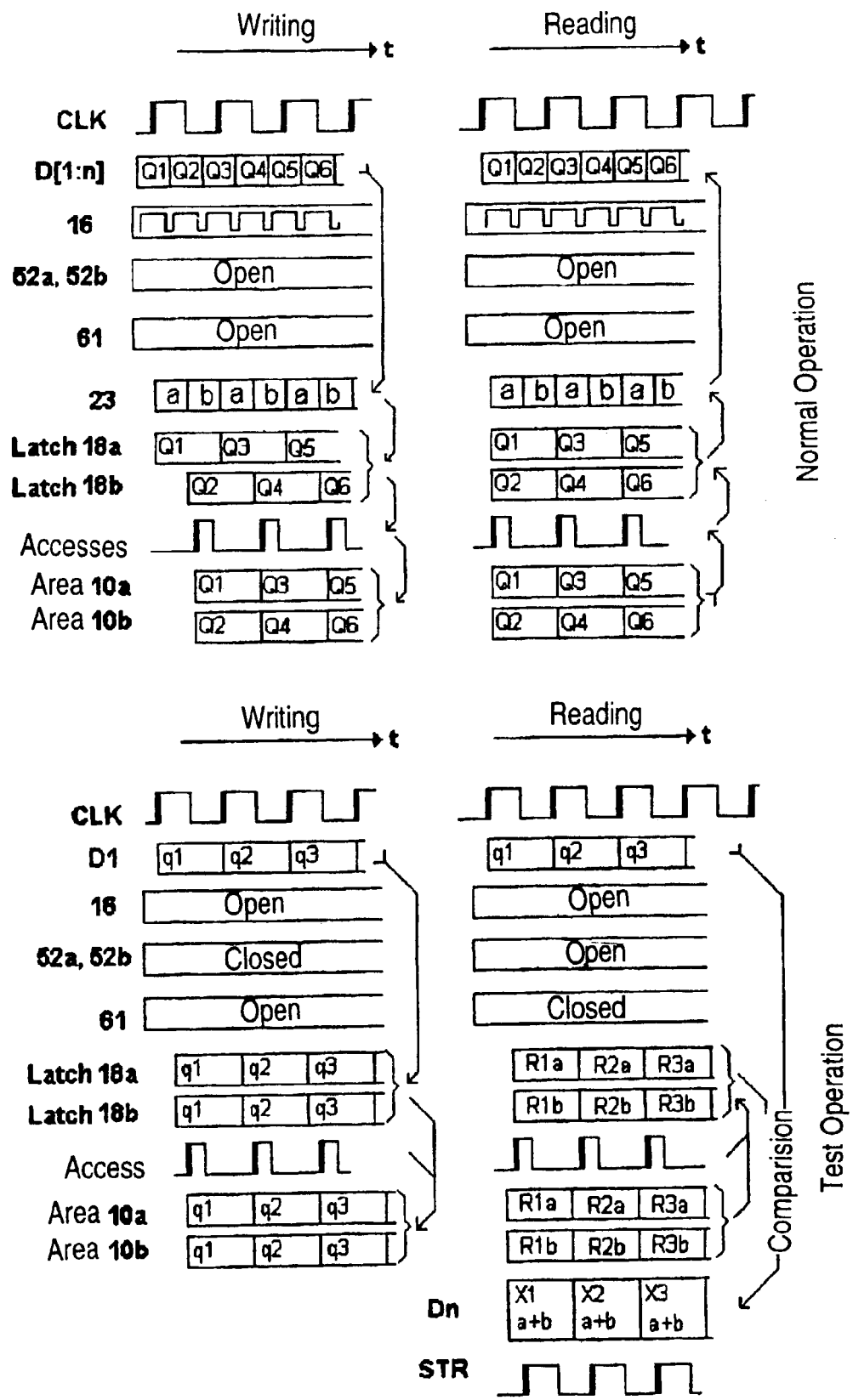
FIG. 4 is a timing diagram for elucidating the operation of the configuration according to FIG. 3.

In addition to these known components, the memory circuit 80 contains a test auxiliary device according to the invention, including a switching signal transmitter 50, two n-pole line switches 52a and 52b and an evaluation device 60, which contains a 2n-pole line switch 61 and a comparator 62. The switching signal transmitter 50 can be brought into a test mode by a test mode setting signal TM, in which mode it supplies switching signals in a time-controlled manner for the actuation of the switches 16, 52a, 52b, and 62 for a test operation. When signal TM is inactive, the switching signal transmitter 50 is in a "normal mode", in which it supplies the switching signals with a different time control in order to allow the normal memory operation. The timing diagram depicted in FIG. 4 illustrates the normal operation in its upper half and the test operation of the memory circuit 80 in its lower half.

In the normal operation of the memory circuit 80, the switches 52a, 52b, and 60 are kept open. The normal operation of a DDR-DRAM memory circuit of the type shown in FIG. 3 is generally known and, therefore, need not be explained down to the last detail. Therefore, here just a brief summary of this normal operation:

In the normal write operation, the data to be stored are applied in the form of n-bit parallel words to the data terminals D[1:n] with a data rate (repetition frequency of the data words) that is equal to double the rate of the clock CLK.

The switch 16 is keyed synchronously with the data rate, in that, it is temporarily closed both upon the rising edge and upon the falling edge of the clock signal CLK, in order to successively pass the data words onto the data bus 17. From there, the data words pass to the n-pole changeover switch 23, which in this case operates as a demultiplexer and is controlled by a switching signal S23 in a manner synchronized with the clock signal CLK. In a manner synchronized with the rising clock edges, the changeover switch 23 leads into the position a depicted bold, at which it connects the data bus 17 to the branch bus 17a. In a manner synchronized with the falling clock edges, the changeover switch leads into the position b depicted by dashes, at which it connects the data bus 17 to the branch bus 17b. Consequently, the data words are loaded alternately into the latch 18a and the latch 18b. Within every second clock half, that is to say with a repetition frequency corresponding to single clock rate, the control section 19, via control lines 21, causes the selection device 11 to produce an n-bit write connection from the latch 18a to a selected group of n memory cells in the area 10a and at the same time to produce an n-bit write connection from the latch 18b to a selected group of n memory cells in the area 10b, the selection being effected in a manner dependent on the address bits which are provided at this instant on the address buses 13 and 15. Thus, two successively received n-bit data words are in each case written in simultaneously at different memory cell groups of the memory matrix 10.

In the normal read operation, the selective accesses likewise take place with single clock rate of CLK, to be precise in each case simultaneously to two different memory cell groups (one in the area 10a and the other in the area 10b), in a manner similar to that in write operation. Consequently, two read data words are always ready for the duration of a clock period in the two latches 18a and 18b, which data words are in each case supplied to the data terminals D[1:n] successively via the changeover switch 23, which acts as a multiplexer in this case, with double the clock rate.

The test operation according to the invention of the memory circuit 80 will now be described. The auxiliary device already mentioned, whose elements are designated by the reference numerals 50-66, serves for realizing the test operation. The test operation is realized by the connection of a test unit 90, as has already been described with reference to FIG. 1, and by the application of the test mode setting signal TM to the switching signal transmitter 50.

The test mode includes a write operation and a subsequent read operation with evaluation of the data read. In this case, the address, control and clock information items are derived from the connected test unit 90 via the internal address buffers 12, 14 and the internal control section 19. The clock CLK of the test unit is half as fast as the data rate for which the memory circuit 80 is specified.

The write operation of the test mode will be explained first. The test write operation, the sequence of which is illustrated in the lower left-hand part of FIG. 4, runs for the duration of a write operation signal WRD provided by the control section 19. This signal causes the switching signal transmitter 50 to keep the switches 16 and 61 open by using the switching signals S1 and S6 and to keep the switches 52a and 52b closed by using the switching signal S5. Consequently, all the data terminals D[1:n] are disconnected from the data bus 17, and the data terminal D1 is connected simultaneously to all n lines of the first branch bus 17a and to all n lines of the second branch bus via a bridging line 51 and the closed switches 52a and 52b. With the timing of the clock signal CLK, the test unit 90 supplies successive test write data q1, q2, q3, etc., each including a single bit with the binary value "0" or "1", to the data input D1 and successive address information items to the address terminals A[0:k].

Each test write datum q1, q2, q3 passes from the data terminal D1 via the line 51 and the two closed switches 52a and 52b in each case simultaneously onto all n lines of the branch bus 17a and onto all n lines of the branch bus 17b. Consequently, the latches 18a and 18b simultaneously provide two n-bit data words in each case for the duration of a clock period, the bits of which words all have the same value "0" or "1", depending on the binary value of the respective test write datum. Consequently, in each period of the clock signal CLK, the respective test datum is simultaneously written to all the memory cells of those memory cell groups in the areas 10a and 10b which are determined by the respective address information.

After a number or all (generally: a plurality i) of the memory cell group pairs of the matrix 10 have been filled with the same datum "0" or "1" within each pair in this way, the test read operation described below begins, the sequence of which is illustrated on the lower right-hand side in FIG. 4. During the test read operation, which runs for the duration of a read operation signal RDD provided by the control section 19, the switch 16 remains open as before, and the switches 52a and 52b are likewise open. The 2n-pole switch 61 is closed in order now to connect all 2n lines of the two branch buses 17a and 17b to a 2n-bit signal input of the comparator 62.

In the test read operation, the test unit 90 again supplies, from its test data output TD, the successive test data q1, q2, q3, etc. with the CLK clock rate to the data terminal D1, and with the same rate it supplies the respective address information items to the terminals A[0:k]. The test program ensures that the assignment of the binary value of these test data to the address information is the same in this case as in the case of the test write operation described above. However, from the terminal D1, owing to the open state of the switches 16, 52a and 52b, the test data pass neither onto the data bus 17 nor onto the branch buses 17a and 17b, but rather via a line 66 to a reference input of the comparator 62.

In the first CLK clock period of the read operation, a first pair of memory cell groups in the two memory areas 10a and 10b is selected by using the first address information item, specifically precisely that pair to whose memory cells the first test datum q1 was written. These two memory cell groups are read simultaneously, and the n read data of the group of the area 10a pass as n-bit data word R1a into the latch 18a, while the n read data of the group of the area 10b pass as n-bit data word R1b into the latch 18b. Afterward, in the second clock period, when the second address information item is applied, a second pair of memory cell groups in the two memory areas 10a and 10b is selected, specifically precisely that pair to whose memory cells the second test datum q1 was written. These two memory cell groups are read simultaneously, and the n read data of the group of the area 10a pass as n-bit data word R2a into the latch 18a, while the n read data of the group of the area 10b pass as n-bit data word R2b into the latch 18b. This interplay continues, so that the latch pair 18a, 18b successively provides individual 2n-bit read data blocks of in each case two n-bit data words R1a+R1b, R2a+R2b, R3a+R3b, etc. that appear simultaneously.

The stream of these 2n-bit data blocks passes via the branch buses 17a and 17b and the closed 2n-pole switch 61 to the 2n-bit signal input of the comparator 62. The comparator supplies a logic "1" at its output precisely when all 2n bits at the signal input have the same value as the test data bit at the reference input. Consequently, the comparator 62 compares the 2n-bit data block R1a+R1b with the test datum q1 in the first CLK clock period. If no error is present, then all 2n bits of the data block are identical to q1, and the comparator supplies, as first test result X1, a logic "1" ("test passed") via a line to the data terminal Dn, which is connected to the test result input TR of the test unit 90; otherwise a "0" is supplied as test result X1 ("test not passed"). Afterward, in the next clock period, the comparator 62 compares the data block R2a+R2b with the test datum q2 and supplies a "1" or "0" as next test result X1 depending on whether or not all n bits of the data block correspond to the test datum q1.

This interplay is continued in a similar manner with the following 2n-bit data blocks and test data. Consequently, "compressed" test results of in each case two data accesses with the rate of the clock signal CLK appear at the test result input TR of the test unit 90. The sampling of the test result at the reporting circuit 93 can thus be effected by using the strobe signal STR with the CLK rate, and even though the memory circuit 80 runs as fast as in normal operation, that is to say implements two data accesses in each clock period, none of the data accesses is skipped.

Since, in the test operation according to the invention, the function of the multiplex switch 23 is not necessary either during reading or during writing, this switch is preferably kept in the quiescent state throughout the test mode. This shutdown in the test mode can be brought about by using a corresponding signal from the switching signal transmitter 50.

The invention is not, of course, restricted to the embodiments described with reference to the figures, which are merely examples. Modifications are possible, inter alia, with regard to the number m of data accesses or memory cell groups that are in each case encompassed by an individual compressed test result. This number m is equal to 2 in the examples described, but may also be higher, preferably an integer power of 2. Of course, this then correspondingly multiples the ratio of the clock rates of CLKi and CLK and the burst length in the case of a memory circuit constructed for single data rate and the number of branch buses and the width of the comparator signal input in the case of a memory circuit constructed for multiple data rate.

In a memory circuit constructed for multiple data rate, a test auxiliary device according to the invention may, of course, likewise utilize an internal address counter, as is indicated in FIG. 3 by the address counter 22 depicted by broken lines therein. In such a case, there may be connected downstream of the comparator 61 in the evaluation circuit 60 a similar configuration of an RS flip-flop 44 (indicated by broken lines in FIG. 3) as was described above with reference to FIG. 1. In such an embodiment, the "compression factor" m, that is to say the number of memory cell groups which are encompassed by the compressed test result, is not equal to the number of branch buses, but rather is additionally increased by a multiplication factor which is equal to the burst length r of the address burst counted by the address counter 22. In other words, the "compression factor" m is then equal to the product p*r, if p is the number of branch buses and r is the burst length.

Instead of the RS flip-flop 44 shown in FIGS. 1 and 3, it is also possible to use any other circuit configuration in order to combine the r partial results of a burst of r successive read accesses with one another in such a way that the compressed test result is ready after all these partial results have been obtained. Thus, it is also possible to store all r partial results of a burst, for instance by inputting into an r-stage shift register, and combining them at the end of the burst in parallel in an AND gate.

It holds true for all the embodiments that the order of the addressing in the test read operation need not necessarily be exactly the same as during the test write operation. All that is important is that, during every read addressing, the same test data bit is provided as during the previous writing at the same address.

The inherent system delays on account of propagation times and transient recovery processes are not taken into consideration in the description and in the diagrams, for the sake of simplicity and clarity. In practice, of course, compensating delays familiar to the person skilled in the art will have to be provided in the signal, clock and data paths in order to ensure the precise and correct timing of the switching functions.

In the case of a plurality of memory banks within the memory circuit, the row and column addresses are also accompanied, of course, by a bank address in order to selectively address the individual banks for the test operation.

The line and changeover switches used are illustrated symbolically as mechanical switches in FIGS. 1 and 3. In reality, semiconductor switches are used, usually with a MOSFET structure.

We claim:

1. A test auxiliary device for testing a RAM memory circuit containing a multiplicity of memory cells, an input/output device for receiving and outputting memory data, having an address input for applying address information items, and having a selection device for selecting groups of n $\geq$ 1 memory cells depending on the address information being applied and for one of writing in and reading out a group of n data at the respectively selected memory cell group, the test auxiliary device comprising:
   a test control device for applying control, data, and address information items to the selection device;
   in a test write operation, said test control device applying subsequentially test data for j subsequent write cycles at a first clock speed;
   in each write cycle, the selection device selecting m memory cell groups, where j and m are in each case integers $\geq$ 2, and writing subsequentially, on a group by group basis, one of said test data as an identical datum to all of the memory cells of the m selected memory cell groups at a second clock speed faster than said first clock speed;
   in a test read operation, said test control device carrying out j subsequent read cycles at a third clock speed;
   in each read cycle, the selection device reading data subsequentially, on a group by group basis, from the m selected memory cell groups as a read data block including m*n data at a fourth clock speed faster than said third clock speed;
   an evaluation device determining and providing a compressed test result indicating if all of the m*n data of the read data block correspond to the identical datum written therein; and
   said evaluation device outputting subsequentially said compressed test result.

2. The test auxiliary device according to claim 1, wherein the RAM memory circuit further has a clock generator for generating a clock signal, operates normally with a data rate equal to a rate of the clock signal, and the input/output device thereof is to be connected to the selection device via an n-bit data bus having lines; the test auxiliary device further comprising:
   an address changeover unit generating, from each of the address information items, a sequence of m different addresses for selecting m different memory cell groups with the rate of the clock signal;
   a switch connecting all of the lines of the data bus to a test data terminal for applying a test data bit in the write cycle and to the evaluation device in the read cycle; and
   a comparator in the evaluation device for, in the read cycle, comparing each bit of n-bit data words appearing in m directly successive periods of the clock signal on the data bus with the same test data bit and for providing a result after comparing as a compressed test result.

3. The test auxiliary device according to claim 1, wherein the RAM memory circuit normally operates with a data rate equal to m times a rate of a clock signal and has m parallel n-bit branch buses leading to the selection device and is to be connected cyclically to the input/output device via a multiplexer, the multiplexer being switchable at the data rate, the selection device being controllable at the rate of the clock signal in order. simultaneously to select from m disjoint areas of the memory bank, at least one of the memory cell groups existing for each of the m branch buses; the test auxiliary device further comprising:
   a comparator having a m*n-bit signal input, having a reference input for receiving a test data bit, and an output for indicating as a compressed test result if all the bits of the m*n-bit signal input correspond to the test data bit; and
   a switch connecting all the lines of the m branch buses to a test data terminal for applying the test data bit in the write cycle and to the n*m-bit signal input of the comparator of the evaluation device in the read cycle.

4. The test auxiliary device according to claim 1, wherein m is equal to 2*, where x is an integer at most equaling 1.

5. The test auxiliary device according to claim 1 for testing the RAN memory circuit normally operating with a data rate equal to p times a rate of a clock signal, and having p parallel n-bit branch buses leading to the selection device, and connected cyclically to the input/output device via a multiplexer, the multiplexer being switchable at the data rate, the selection device being controllable at the rate of the clock signal in order simultaneously to select from p disjoint areas of the memory bank, in each case a memory cell group existing for each or the p branch buses; the test auxiliary device further comprising:
   an address changeover unit generating from each of the address information items a sequence of r different addresses with the rate of the clock signal for selecting r different memory cell groups in each of the p areas of the memory bank;
   a comparator having a p*n-bit signal input, having a reference input for receiving a test data bit, and an output indicating a partial result "test passed" precisely when all bits of the p*n-bit signal input correspond to the test data bit;
   a switch connecting all of the lines of all of the p branch buses to a test data terminal for applying the test data bit in the write cycle and to the p*n-bit signal input of the comparator of the evaluation device in the read cycle; and
   a device indicating as a compressed test result if all r partial results having been supplied in r directly successive periods of the clock signal indicate "test passed".

6. The test auxiliary device according to claim 1, wherein the test auxiliary device is integrated with the memory circuit on a single semiconductor chip.

* * * * *